US006836810B1

(12) United States Patent
Klem et al.

(10) Patent No.: US 6,836,810 B1
(45) Date of Patent: Dec. 28, 2004

(54) BACKPLANE SYSTEM USING INCIDENT WAVEFORM SWITCHING

(75) Inventors: R. Craig Klem, North Yarmouth, ME (US); Carl R. Poirier, Biddeford, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 381 days.

(21) Appl. No.: 09/821,558

(22) Filed: Mar. 29, 2001

(51) Int. Cl.[7] ............................ G06F 13/00; H05K 7/10
(52) U.S. Cl. ...................... 710/301; 370/201; 361/201; 379/394; 340/310.05
(58) Field of Search ................... 710/301; 370/201; 361/737; 379/394; 340/310.05

(56) References Cited

U.S. PATENT DOCUMENTS

| | | | | |
|---|---|---|---|---|
| 4,697,858 A | * | 10/1987 | Balakrishnan | 439/61 |
| 4,821,145 A | * | 4/1989 | Corfits et al. | 361/692 |
| 4,821,146 A | * | 4/1989 | Behrens et al. | 361/692 |
| 5,023,488 A | | 6/1991 | Gunning | |
| 5,485,107 A | | 1/1996 | Lacey et al. | |
| 5,650,757 A | | 7/1997 | Barber | |
| 5,666,557 A | * | 9/1997 | Cassidy et al. | 710/8 |
| 6,070,211 A | | 5/2000 | Neal et al. | |
| 6,112,271 A | * | 8/2000 | Lanus et al. | 710/306 |
| 6,265,914 B1 | * | 7/2001 | Randhawa | 327/108 |
| 6,356,966 B1 | * | 3/2002 | Loach et al. | 439/78 |
| 6,434,647 B1 | * | 8/2002 | Bittner, Jr. | 710/100 |
| 6,437,660 B1 | * | 8/2002 | Sullivan | 333/100 |
| 6,496,380 B1 | * | 12/2002 | Li et al. | 361/760 |
| 2002/0008539 A1 | * | 1/2002 | Osaka et al. | 326/30 |
| 2002/0111068 A1 | * | 8/2002 | Cohen et al. | 439/608 |
| 2003/0068920 A1 | * | 4/2003 | Li et al. | 439/502 |

FOREIGN PATENT DOCUMENTS

JP        09312451 A    * 12/1997    ............ H05K/1/02

OTHER PUBLICATIONS

Yu, ZZ, et al., "The Precision–Engineered Heat Pipe for Cooling Pentium II in CompactPCI Design," May 23–26, 2000, IEEE, The Seventh Intersociety Conference on Thermal and Thermomechanical Phenomena in Electronic Systems, vol. 2, p. 102–105.*

(List continued on next page.)

Primary Examiner—Xuan M. Thai
Assistant Examiner—Donna K. Mason
(74) Attorney, Agent, or Firm—Cesari and McKenna, LLP; Edwin H. Paul, Esq.

(57) ABSTRACT

A backplane bus system and related method for increasing the throughput of cPCI-specified backplane architectures. The system includes an interposer card for transforming reflective-wave switching into incident-wave switching. Establishing incident-wave switching on the bus along with careful slot pitch and impedance layout increases the rate at which the voltage amplitude observed by all receivers connected to the bus is sufficient to produce a change of state on the first signal propagation down the bus. Most existing peripherals are configured with transceivers that produce reflective-wave switching. The present system includes an interposer card to transform that switching into incident-wave switching. A preferred transceiver for doing so and that is implemented on the interposer card is a GTLP transceiver. A state machine is employed to regulate operation of the incident-wave switching transceiver. The system may be used to permit implementation of as many as 21 slots on a conventional cPCI backplane.

20 Claims, 3 Drawing Sheets

OTHER PUBLICATIONS

"COMPACTPCI Specification Short Form," Sept. 2, 1997, PCI Industrial Computers Manufacturer Group (PICMG), Rev. 2.1, p. 1–7.*

"Signal Integrity, Bandwidth and Backplane Termination", Klem, R. Craig, Fairchild Semiconductor Corporation, Systems Chip 99, Oct., 1999.

"GTLP: Indicent Wave Switching and Throughput"; AN–5014, Fairchild Semiconductor Application Note, Jul. 1999, revised Dec., 1999.

"Extension of PCI Bus to 21 Slots using GTLP Transceiver", Siegl, Chris; Klem, R. Craig; 2000 IEEE, reprinted with permission from IEEE SoutheastCon 2000, Apr. 7–9, 2000.

* cited by examiner

BACKPLANE SYSTEM USING INCIDENT WAVEFORM SWITCHING

BACKGROUND OF THE INVENTION

1. Field of the Invention

The present invention relates to system interfaces for backplane technology. More particularly, the present invention relates to bridges and switching systems for establishing transmission interfaces among circuit boards or cards installed in computing device backplanes. The system enables the insertion of a greater number of cards in a backplane topology than has heretofore been possible.

2. Description of the Prior Art

Standards have been established for the architecture of the hardware employed to enable the exchange of electrical signals among processing devices. The processing devices include integrated circuit systems built on and using printed circuit boards by an increasingly wide array of suppliers. The architecture standards ensure that the various devices will, in fact, be able to communicate with one another as well as with central processing units that control the operation of such peripheral devices. These peripherals include, but are not limited to, printer interfaces, video, audio, and graphics interfaces, memory, external communications interfaces, or any other sort of discrete device performing particular computer-related functions.

The circuit boards associated with the peripherals may be activated upon connection with a primary hardware board, often referred to as a motherboard. The motherboard establishes the interconnection of the central processing unit, power, memory structures, and a backplane bus. The backplane bus is a primary communication interface coupling line having connections to one or more slots or sockets in parallel into which the peripheral circuit boards may be inserted. The slots include physical connectors and input/output interfaces to establish reception and transmission of signals among all devices coupled to the motherboard through the backplane bus. It is the architecture of the backplane bus that establishes the interface architectures required for the peripheral boards so that communication can occur between all peripherals and the central processing unit in an organized manner.

Several communication hardware protocols have been developed, a number of which have been or are being phased out as being inadequate to support the faster signal exchange rates and increased bandwidth required by newer applications. One of the first such architecture protocols that remains in use on older motherboards is the Industry Standard Architecture (ISA). ISA is an expansion bus slot configuration that accepts plug-ins for peripherals including sound and video displays, for example. Earlier ISA slots were of 8-bit configuration but they are mainly 16-bit slots now. A modified version of ISA, Extended ISA (EISA) was developed to extend the bus capacity to 32-bit with essentially the same convention applied to the ISA backplane slot architecture. Unfortunately, it is designed to run at the relatively slow ISA rate of 8 MHz clocking. In today's computing world, that is often too slow.

Although ISA had been the primary standard, the Peripheral Component Interconnect (PCI) bus is now the most frequently implemented interface architecture. Although it continues to replace ISA, that architecture will be used by peripherals designers for as long as computing devices including ISA slots remain in use. PCI provides a relatively high-speed data path (33 MHz) among connected boards. PCI Local Bus is an open architecture specification that allows applications designers greater freedom in interface formation. PCI provides "plug and play" capability in that any peripherals with PCI-based interfaces are automatically configured at start up and therefore generate little to no delay for the central processing unit to establish communication. One advantage of PCI is that it permits the sharing of IRQs. An IRQ (Interrupt ReQuest) signals the central processing unit that activity associated with a peripheral device has started or ended. Since motherboards are configured with only a limited number of IRQ lines, any interface architecture that requires dedicated IRQ lines is necessarily limited. Such is the case with ISA, but not with PCI. For that reason, PCI architecture is ordinarily the first choice.

While the PCI design is an improvement on ISA, it has a history of problems with edge connectors, poor thermal characteristics, and limited interface (input/output—I/O) capability. In fact, PCI backplane configuration is limited to only four slots. That is due in part to the need to resolve signal reflections or noise at the board-to-backplane interface. Subsequent developments to double the clock rate to 66 MHZ and to increase the bus width accommodated some of the reflection problems, resulting in a doubling to eight of the number of available PCI slots. That improvement established a new slot architecture referred to as eXtended PCI (PCI-X) architecture. Unfortunately, while providing more slot availability, PCI-X continues to suffer from the same problems associated with PCI.

Because of interconnection limitations associated with the PCI architectures, there are limits on the number of peripheral devices that may be coupled together. Bridging together two PCI-based backplanes may increase slot capacity; however, that simply increases the size/number of the computer device required to establish desired functionality. It also introduces its own latency and transmission complications. As a result, the Personal Computer Industrial Computer Manufacturing Group (PICMG) developed a standard to address these problems with the PCI functionality. The PICMG combined the architecture of the Eurocard interface with a passive backplane (that is, no active devices to regulate signal propagation, only passive elements), and a high-quality, high-density pin-and-socket arrangement to make improvements. All motherboard components are hence moved from the now passive backplane to a Single Board Computer (SBC) card to be present in the system slot of the passive backplane. The relatively new connection architecture, identified as COMPACTPCI, a registered trademark of PCI Industrial computers manufacturers Group (hereinafter referred to a cPCI), improved the peripheral board-to-backplane impedance match, thereby reducing unwanted reflections at that interface. cPCI is designed to be a more robust interface connector to establish solid electrical connections.

The improvements established in cPCI generated the ability to provide eight PCI slots at a 33 MHz-lock rate. However, at higher clock rates the number of available slots is reduced because of the reflective wave signaling technology being used. Using reflected wave technology means the signal travels at half its intended amplitude until it reaches the end of the backplane where it doubles to its intended amplitude and propagates back down the backplane to its point of origin. This round trip delay physically limits the backplane to the number of slot connections it can have for a given clock frequency. The cPCI architecture at 66 MHz available in typical computing systems has thus been limited to five open slots.

What is needed is a backplane architecture and interface system that allows for a greater number of slots available for peripheral connections without increasing the footprint of the backplane. Further, what is needed is a backplane architecture and related system that expands the number of slots available without requiring bridging from one backplane to another. Yet further, what is needed is such a backplane architecture and related system that does not compromise the integrity and rate of signal reception and transmission. Still further, what is needed is such a backplane architecture and related system that may optionally be compatible with legacy interface architectures including, but not limited to, ISA.

SUMMARY OF THE INVENTION

It is an object of the present invention to provide a backplane architecture and interface system that provides for an increase in the number of slots available for peripheral connections without increasing the footprint of the backplane. It is also an object of the present invention to provide a backplane architecture and related system that expands the number of slots available without requiring bridging from one backplane to another. It is another object of the present invention to provide a backplane architecture and related system that does not compromise the integrity and rate of signal reception and transmission. Still further, it is an object of the present invention to provide a backplane architecture and related system that may optionally be compatible with legacy interface architectures including, but not limited to, ISA.

These and other objects are achieved in the present invention by establishing a backplane bus driver arrangement that produces incident wave switching rather than reflective wave switching. That is, the driver establishes a voltage swing or step that is of sufficient amplitude to ensure that all receivers coupled to the bus recognize that swing as a valid change of logic state on the first signal edge. Presently, much of the signal propagation associated with PCI architecture is generated at the board level through CMOS, TTL, and LVTTL drivers and receivers, and their equivalents. Those drivers/receivers generate voltage swings that exceed 1.5 volts in order to produce changes in logic state. When those swing requirements are combined with existing bus impedances related to the connector traces, and the variations in impedances associated with different load impedances, impedance mismatches result. That is particularly the case as increasingly faster switching rates are desired. Those faster switching rates further exacerbate the impedance mismatches, thereby increasing signal noise. The resultant noise must be accounted for so that there is no confusion on the bus. This is achieved by reducing the wave path defined by the bus traces so that the noise settles in time to provide a voltage on the bus that is sufficient to provide a clear logic signal to all receivers on the bus. The path reduction limits the number of connector slots on the motherboard.

The reflective wave propagation is a limit on the bandwidth of the existing motherboard architecture. Unfortunately, it is a common limitation since existing drivers/receivers requiring such reflections are in common commercial use. The present invention involves the application of driver circuitry that generates incident waves rather than reflective waves. One example of such circuitry is the Gunning Transceiver Logic Plus (GTLP) transceiver.

The function of the incident wave switching driver is to ensure a valid change of state on all receivers connected to a backplane bus on the first pass of a propagated transition. For that, the potential of the signal must be strong enough to generate a logic HIGH ($V_{IH}$) on a rising edge and a logic LOW ($V_{IL}$) on a falling edge as each of the connected receivers dictates. If the signal must reflect from the end of the backplane traces to reach a valid potential for signal transition, the driver does not produce incident wave switching. Without incident wave switching, the connector slots must be sufficiently close to the end of the bus to ensure that the reflections generate enough switching potential within a required propagation rate. Therefore, incident wave switching enables longer bus connections without sacrificing signal propagation rate.

The driving circuitry used to generate incident wave switching must be selected with the dynamic characteristics of the backplane in mind. Specifically, variations in capacitance, inductance, and resistance of the bus and the receiver connections affect whether that form of switching is achieved. That is, the driving circuitry must either overcome or balance that variability so that impedance mismatching does not occur, or that it does not generate signal reflection. That resolution of dynamic variability is achieved in the present invention through the selection of appropriate signal driving circuitry and the coupling of appropriate impedance devices between the driving circuitry, its power supply, the bus, and, if required, the individual receivers associated with the individual cards.

As indicated, the driver used in the present invention must be capable of generating incident wave switching. One type of circuit for doing so is described in pending U.S. patent application Ser. No. 09/132,595 of Oscar Freitas, filed Aug. 11, 1998, and assigned to a common assignee. The content of that application is incorporated herein by reference. One example of such a driver is the GTLP transceiver, such as model GTLP18T612 offered by Fairchild Semiconductor of South Portland, Me. This driver (transceiver) slows the signal transition enough to minimize noise significantly and therefore avoids reflections.

In addition to the introduction of an incident wave-switching driver, the present invention includes a fairly specific backplane layout to assist in minimizing impedance mismatches. Specifically, the stub impedance (impedance of the connectors for connecting a daughter card to the backplane bus), and backplane impedance. In general, the present invention shortens the connector stubs (thereby reducing their impedances), while maintaining the backplane impedance at or near its current typical value. The present invention relates to selecting appropriate values for those characteristics of the layout and coupling that with suitable incident wave driver technology to increase the number of slots available on a cPCI backplane or PCI/PCI-X motherboard layout without compromising signal integrity or throughput. It further includes resolution of appropriate signal clocking to minimize clock skew.

As earlier noted, most of the existing peripheral devices employ driver circuitry that generates reflective wave switching. The fabrication of such devices on cards containing such drivers is well defined and well established. For that reason, it would be difficult to conveniently convert those processes to substitute incident wave drivers that would be compatible with the backplane layout improvements described. The present invention includes an interface bridge or interposer that addresses that difficulty. Specifically, the present invention includes an interface circuit that translates the driver/receiver switching architecture associated with each daughter card into driver/receiver switching architecture that produces incident wave switching. For example, the interface circuit may be a TTL-to-GTLP converter that produces the signal swing required to present a valid $V_{IH}$ on a rising edge and a valid $V_{IL}$ on a falling edge during a first propagation on the backplane bus.

The present invention includes a new backplane layout. That combined with incident wave switching and an interface circuit to enable incident wave switching produce a decided advantage in the number of cPCI slots that may be supplied on a backplane without increasing the board footprint and without bridging between or among backplanes. These and other advantages of the present invention will become apparent upon review of the following detailed description, the accompanying drawings, and the appended claims.

DESCRIPTION OF THE PREFERRED EMBODIMENTS OF THE INVENTION

Figure 1:
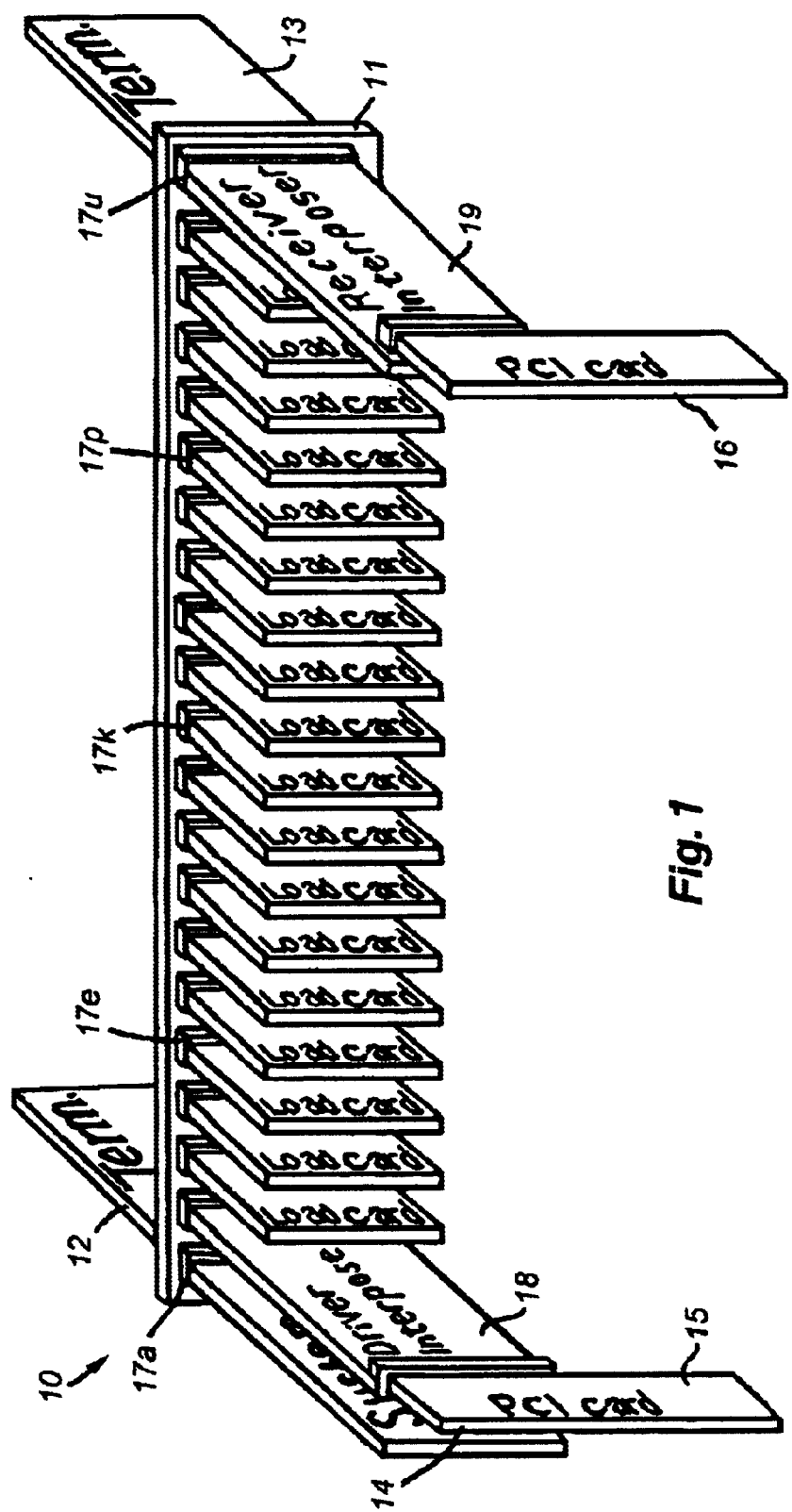
FIG. 1 is a perspective view of the backplane system of the present invention, showing 21 slots on a 19" IEEE 1100.10 standard footprint.

A backplane system 10 of the present invention is shown in FIG. 1. The system 10 includes a backplane bus 11 having matched impedance terminations 12 and 13 on the back or south side of the bus 11. The impedance values of the terminations 12 and 13, the impedance values of the slot connectors identified herein, and the impedance values of the backplane bus traces 11, together provide the backplane impedance of the system 10. The impedance terminations 12 and 13 are coupled to a supply rail that establishes the maximum swing potential of the backplane bus 11. The system further includes a system clock card 14 that generates the clocking scheme for each of one or more of a plurality of peripheral devices provided on daughter cards such as near card 15 and far card 16. Each card includes one or more integrated circuits for performing functions of interest regulated by one or more central processing units tied to the backplane bus 11. The cards 15 and 16 are of the type that may be inserted into conventional cPCI backplane slots such as slots 17a–17u shown. The slots are located on the front or north side of the bus 11.

The system 10 further includes one or more interposer cards such as interposer cards 18 and 19 that translate reflective wave switching associated with the conventional peripheral devices such as cards 15 and 16, into incident wave switching. The interposer cards 18 and 19 include translation circuitry to convert TTL-based potential swings into narrower potential swings, such as those associated with GTLP transceivers, for example. The interposer cards 18 and 19 further include logic and control circuitry for regulating the propagation of converted signals to and from the backplane bus 11.

Figure 2:
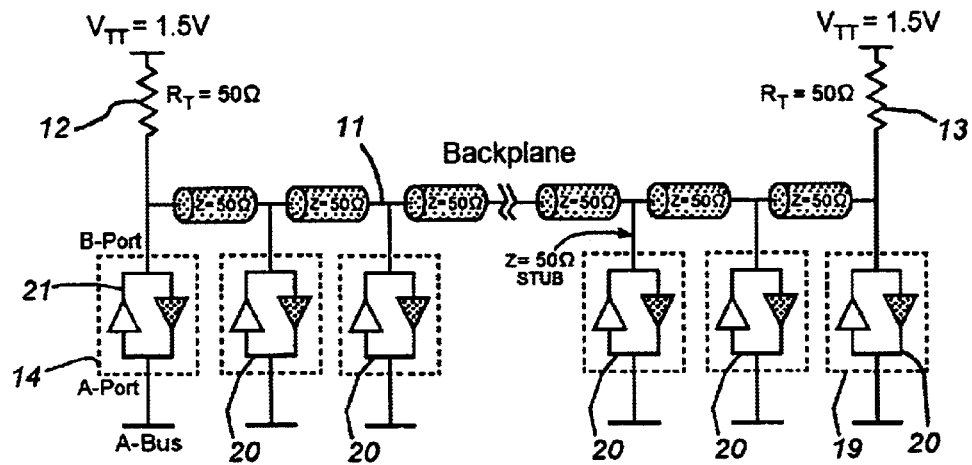
FIG. 2 is a simplified schematic diagram of the backplane system of the present invention, showing the incident wave switching interfaces and the related stub impedances and backplane impedances suitable for minimizing impedance mismatches.

As illustrated in FIG. 2, the system 10 includes for each slot an interposer card, such as interposer cards 18 and 19. Each card in a slot of the backplane bus 11 includes a transceiver 20 that receives or transmits input/output signals from or to the bus 11. A suitable transceiver 20 is the GTLP18T612 driver offered by Fairchild Semiconductor of South Portland, Me. That transceiver converts all bus signals to GTLP levels, along with any control signals. System card 14 includes an incident wave compatible clocking scheme, such as a GTLP clocking device 21 for use with GTLP transceivers 20. Preferably, the GTLP clocking device is the GTLP16C816 clock driver offered by Fairchild Semiconductor Corporation of Portland, Me. That clocking device 21 drives and receives the GTLP clock and it generates the clocks for all of the peripheral cards connected through an interposer to the bus 11, such as cards 15 and 16 of FIG. 1.

Figure 3:
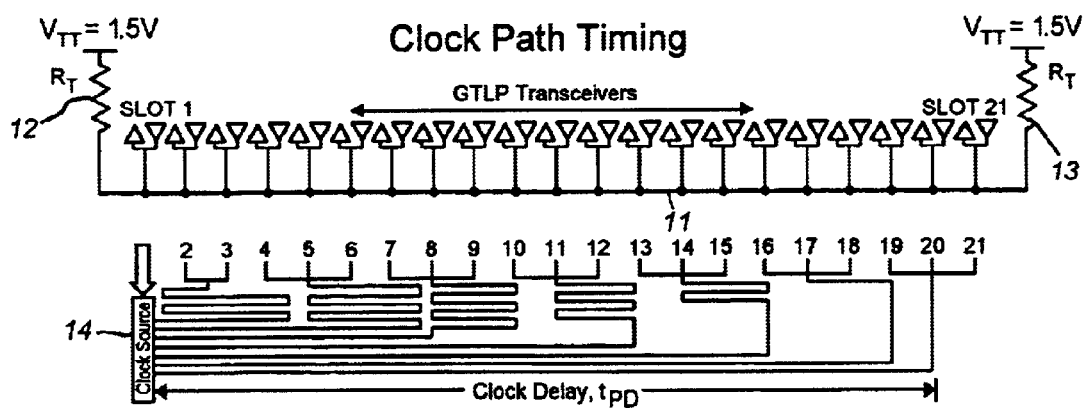
FIG. 3 is a layout of the preferred clock path timing for the incident wave switching interfaces suitable for minimizing clock skew.

FIG. 3 represents a preferred clock path-timing scheme to minimize clock skewing. As can be seen, sets of backplane slots of the bus 11 are coupled through their respective transceivers to the system card 14 that includes the GTLP clock driver. Each pathway for the respective sets of slot drivers is preferably of the same length. In that way, clock skew across the equivalent clock sets is reduced. The number of slots tied to each clock driver of the system card 14 is dependent upon pin spacing size and spacing limitations and the particular driver employed. For the GTLP16C816 clock driver, the number of slots coupled in parallel with a particular clock driver is preferably three.

Returning to FIG. 2, the configuration of the backplane bus 11 and the impedance elements connected thereto is important in minimizing mismatches that would prevent incident wave switching. It has been determined through evaluation that in order to achieve that goal, the terminals 12 and 13 should be about 0.5 inches in length with an impedance of about 65 ohms, and the connector or stub length for the individual slots should be 0.75 inches, with an impedance of about 50 ohms. When loaded, the impedance of the bus 11 may be between about 20 ohms and about 30 ohms but for optimal operation the system impedance provided by terminations 12 and 13 is about 40 ohms.

Figure 4:
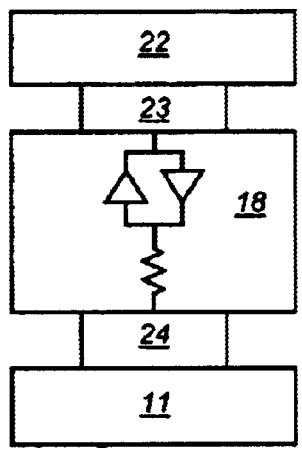
FIG. 4 is a simplified representation of the coupling of a cPCI backplane and a peripheral card that is cPCI configured through an interposer card of the present invention.

The interposer card is preferably implemented as an interposer state machine and the GTLP transceivers. As illustrated in FIG. 4 for a cPCI backplane architecture and a cPCI configured peripheral card 22, the interposer is coupled directly between the peripheral card 22 by a card connector 23. The interposer card is similarly coupled to the slot of the backplane 11 by way of an interposer connector 24.

Figure 5:
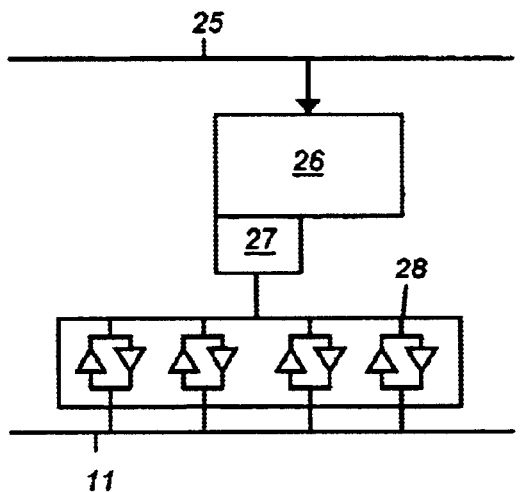
FIG. 5 is a simplified diagram of the coupling of a cPCI backplane and a peripheral card that is configured through a standard cPCI bridge coupled with a state machine for conversion of a reflective wave driver system to an incident wave driver system.

As shown in FIG. 5, with a peripheral card 25 having cPCI architecture, a cPCI interface 26, such as any of those commonly programmed into Altera's APEX family of devices, is used to establish an otherwise conventional interface between the card 25 and the backplane 11. The interface 26 is modified such that it includes interposer state machine circuitry 27 for timing, addressing and arbitration, as an ASIC, a complex programmable logic device (CPLD), or as a field-programmable gate array (FPGA) configured to control operation of the transceivers 28. The state machine 27 may be coupled as a separate integrated circuit to the interface 26 or it may be fabricated on the same chip as the interface 26 as shown. That is, the state machine 27 may be incorporated into the fabrication of the interface 26. Optionally, it may be fabricated as part of the fabrication of the interposer card. It may also be a stand-alone device connected to the relevant circuitry of the interface 26. It is to be noted that the transceivers 28 may also be stand-alone devices physically connected to the relevant circuitry of the interposer card either on the same circuit board or on another board. They may also be fabricated in silicon integrally with the fabrication of the associated circuitry of the interposer card or the interface.

Figure 6:
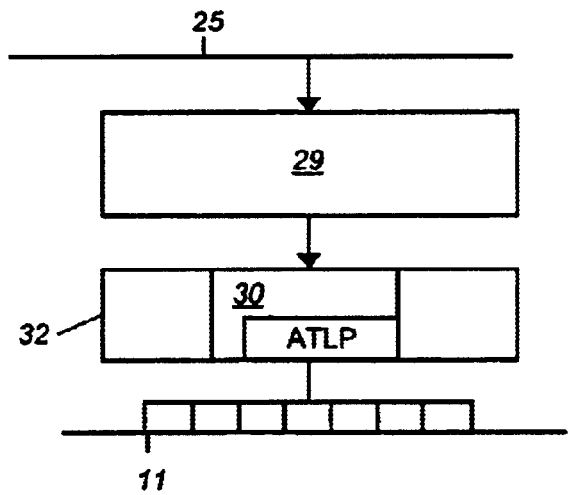
FIG. 6 is a simplified diagram of a coupling of a cPCI backplane and a peripheral card that is configured through a modified cPCI bridge with state machine for coupling to an incident wave driver system.

In an alternative embodiment of the interface shown in FIG. 6, the peripheral card 25 having cPCI architecture, the cPCI interface 26 of FIG. 5 is fabricated as an integrated modified interface 29 including interposer state machine circuitry 30 and the transceiver 31 forming part of a comprehensive integrated incident wave interface 32 used to establish an otherwise conventional interface between the card 25 and the backplane 11. The interface 29 is modified with the state machine circuitry 30 for timing, addressing and arbitration, as an ASIC, a CPLD, or a FPGA configured to control operation of the integrated transceivers such as integrated transceiver 33, one for each slot of the backplane bus 11.

Using representative operating specifications for the GTLP18T612 transceiver listed in Table 1 and applying them to the cPCI specifications listed in Table 2, it can be seen that the present invention enables design of a 21-slot backplane at 33 MHz and an alternative 14-slot backplane at 66 MHz. The calculations for that analysis show that the backplane delays associated with the incident wave switching permit substantially more slots.

TABLE 1

Summary of GTLP18T612 Specifications

| Parameter | Value | Units |
| --- | --- | --- |
| $T_{Prop\ delay\ TTL\ to\ GTLP\ out}$ | 6.3 max | Nanoseconds |
| $T_{Prop\ delay\ GTLP\ to\ TTL\ out}$ | 5.8 max | Nanoseconds |
| $T_{Setup\ TTL\ to\ clock}$ | 1.1 max | Nanoseconds |
| $T_{Setup\ GTLP\ to\ clock}$ | 3.0 max | Nanoseconds |
| $T_{Prop\ delay\ clock\ to\ GTLP\ out}$ | 6.5 max | Nanoseconds |
| $T_{Prop\ delay\ clock\ to\ TTL\ out}$ | 4.6 max | Nanoseconds |

TABLE 2

Summary of PCI Timing Budget

| Parameter | PCI-X @ 133 | PCI-X @ 100 | PCI @ 66 | PCI @ 33 | Unit MHz |
| --- | --- | --- | --- | --- | --- |
| $T_{val}$ (max) | 3.8 | 3.8 | 6.0 | 11.0 | Nsec. |
| $T_{prop}$ (max) | 2.0 | 4.5 | 5.0 | 10.0 | Nsec. |
| $T_{skew}$ (max) | 0.5 | 0.5 | 1.0 | 2.0 | Nsec. |
| $T_{su}$ (min) | 1.2 | 1.7 | 3.0 | 7.0 | Nsec. |
| $T_{cyc}$ | 7.5 | 10.0 | 15.0 | 30.0 | Nsec. |

In the first scenario for 33 MHz backplane operation, assume a PCI-X compliant peripheral card with cPCI hardware designed for 100 MHz operation (resulting in the equivalent of the timing budget for 100 MHz operation in Table 2 above) coupled to an interposer card of the present invention that includes the GTLP18T612 transceiver and an appropriate clock driver. The values presented in Table 1 apply to a slot pitch of 0.8 inches. Therefore, for a 19" IEEE 1100.10 backplane architecture, that is the equivalent of a 21-slot backplane. The total time delay value associated with worse case TTL-to-GTLP output for that backplane arrangement equals 3.8+6.3 nanoseconds. That is 0.9 nanoseconds more than the budgeted $T_{val}$ for cPCI @ 33 MHz. The combined setup time is 1.7+5.8 nanoseconds. That is 7.7 nanoseconds or 0.7 nanoseconds over $T_{SU}$ for cPCI @ 33 MHz. The timing budget is therefore 10.0−0.9+0.7 nanoseconds=9.8 nanoseconds. Since system propagation delay is 10 nanoseconds for cPCI @ 33 MHz, the calculated propagation delay available is within the system delay budget and a complete 21-slot backplane can be implemented.

In the second scenario again for 33MHz backplane operation, assume a cPCI compliant peripheral designed for 66 MHz operation (resulting in the equivalent of the timing budget for 66 MHz operation in Table 2 above) coupled to an interposer card of the present invention that includes the GTLP18T612 transceiver and an appropriate clock driver. Again, the values presented in Table 1 apply to a slot pitch of 0.8 inches and so the maximum backplane architecture for a 19" IEEE 1100.10 backplane would be the equivalent of a 21-slot backplane. In this scenario, the total time delay value associated with worse case TTL-to-GTLP output for that backplane arrangement equals 6.0+6.3 nanoseconds or 12.3 nanoseconds. That is 1.3 nanoseconds over the budgeted $T_{val}$ for cPCI @ 33 MHz. The combined setup time is 3.0+5.8 nanoseconds. That is 8.8 nanoseconds or 1.8 nanoseconds over $T_{SU}$ for cPCI @ 33 MHz. The timing budget is therefore 10.0+1.3+1.8 nanoseconds=13.1 nanoseconds. Since system propagation delay is 10 nanoseconds for cPCI @ 33 MHz, the calculated propagation delay is a portion of the system delay budget for a 21-slot backplane. In particular, the available budget is about 69% of that associated with a 21-slot backplane. Therefore, a backplane having 14-slots (21×69%) can be implemented for the indicated peripheral card I/O hardware.

It is to be noted that the two scenarios described above make a 21-slot and a 14-slot backplane architecture available without modification to the clocking associated with the selected transceiver used to produce incident wave switching. However, by conventional timing regulation means, the transceivers associated with the slots may be re-timed so that the interposer card may be employed to generate a cPCI solution at 66 MHz for a 14-slot backplane. Specifically, latching the signal transmissions at the transceiver regulates signal propagation. By latching the transceivers on the rising edge of the clock rate, the signal transfers are delayed by two clock edges (one to acquire into the transmitting GTLP transceiver and one to latch into the receiving GTLP transceiver). The delays are pipelined onto the backplane so that only two latency cycles are required at the start of a burst transfer. In order to do this, the state machine previously described may have to be modified in a manner known by those skilled in the art so that the delays can be accommodated. Through the noted retiming, a 66 MHz backplane may be implemented with far more slots available than is currently available under existing cPCI and PCI-X specifications.

While the invention has been described with reference to particular example embodiments, it is intended to cover all modifications and equivalents within the scope of the following claims.

What is claimed is:

1. A backplane system to connect in common a plurality of peripheral computing devices each on an individual daughter card such that there is a corresponding number of daughter cards, wherein the daughter cards are configured as cPCI-compliant cards each having a slot connector, the backplane system comprising:

a backplane bus having a plurality of slots for receiving one or more of the cPCI-compliant cards, wherein said slots are spaced from one another at a pitch to minimize impedance mismatching, each slot including a card connector; and an interposer card for each daughter card, said interposer card including means to connect to the slot connector and to said card connector such that said interposer card is interposed between the daughter card and a slot of said plurality of slots of said backplane bus, wherein said interposer card is constructed to reduce the reflective wave path from the daughter card to the interposer card, thereby reducing the impedance mismatch and thereby allowing the noise to settle in time for the interposer card to output, in response to receiving a reflective wave, an incident wave switching at said slot connector.

2. The backplane system as claimed in claim 1 wherein said backplane bus is a cPCI backplane, the system further comprising a cPCI interface coupled between said backplane bus and the daughter cards, wherein said interposer card is couplable between said cPCI interface and said slot connector of said backplane bus.

3. The backplane system as claimed in claim 2 wherein said cPCI interface includes a state machine to regulate timing, direction and enablement associated with operation of said interposer card.

4. The backplane system as claimed in claim 3 wherein said state machine and said interposer card are implemented integrally with said interface.

5. The backplane system as claimed in claim 1 wherein said interposer card includes a GTLP transceiver to produce incident wave switching.

6. The backplane system as claimed in claim 1 wherein said backplane bus has an impedance of about 65 ohms.

7. The backplane system as claimed in claim 1 wherein said backplane bus further includes impedance terminations at opposing ends thereof.

8. The backplane system as claimed in claim 7 wherein each of said impedance terminations of said backplane has an impedance of about 40 ohms.

9. The backplane system as claimed in claim 1 wherein each of said slots includes a stub connector having a stub impedance of about 50 ohms.

10. The backplane system as claimed in claim 1 wherein said backplane bus includes 21 of said plurality of slots.

11. A method of increasing the throughput of a conventional cPCI-compliant backplane architecture having a plurality of slots coupled to a common backplane bus for receiving one or more cPCI-compliant daughter cards, the method comprising the step of inserting an interposer card between each of the daughter cards and its corresponding slot, wherein said interposer card includes means for reducing the reflective wave path from the daughter card to the interposer card, thereby reducing the impedance mismatch and thereby allowing the noise to settle in time for the interpose card to output, in response to receiving a reflective wave, an incident wave.

12. The method as claimed in claim 11 further comprising the step of installing at the ends of the backplane bus termination impedances each having an impedance of about 40 ohms.

13. The method as claimed in claim 11 further comprising the step of forming stub connectors of each of the slots with stub impedances of about 50 ohms.

14. The method as claimed in claim 11 further comprising the step of coupling said interposer card with a state machine configured to regulate timing, direction, and enablement of said incident-wave switching.

15. The method as claimed in claim 11 wherein said interposer card includes a GTLP transceiver for generating said incident-wave switching.

16. The method as claimed in claim 11 wherein said backplane bus has an impedance of about 65 ohms.

17. The method as claimed in claim 11 further comprising the step of latching the signal transmissions associated with said incident-wave switching so as to control the signal propagation to and from the backplane bus.

18. The method as claimed in claim 11 wherein the backplane bus is a cPCI backplane and one or more of the daughter cards is a cPCI-compliant card, further comprising the step of interposing between the cPCI-compliant card and the interposer card a cPCI interface.

19. The method as claimed in claim 18 further comprising a state machine formed integrally with said interface, wherein said state machine regulates operation of said interposer card.

20. The method as claimed in claim 18 comprising a state machine formed integrally with said interface, wherein said state machine regulates operation of said interposer card, further comprising the step of forming said interposer card integrally with said interface.

\* \* \* \* \*